United States Patent
Shin et al.

(10) Patent No.: US 9,350,409 B2
(45) Date of Patent: May 24, 2016

(54) MOBILE TERMINAL AND INNER FRAME PROVIDED THEREIN

(71) Applicants: Dongho Shin, Seoul (KR); Byunghwa Lee, Seoul (KR)

(72) Inventors: Dongho Shin, Seoul (KR); Byunghwa Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 329 days.

(21) Appl. No.: 13/836,120

(22) Filed: Mar. 15, 2013

(65) Prior Publication Data

US 2014/0162736 A1     Jun. 12, 2014

(30) Foreign Application Priority Data

Dec. 11, 2012    (KR) ........................ 10-2012-0143278

(51) Int. Cl.
| | |
|---|---|
| H04B 1/08 | (2006.01) |
| H04M 1/00 | (2006.01) |
| B65D 85/00 | (2006.01) |
| B65D 5/52 | (2006.01) |
| B65D 25/24 | (2006.01) |
| G08B 1/08 | (2006.01) |
| G08B 23/00 | (2006.01) |
| H05K 5/00 | (2006.01) |
| H05K 7/00 | (2006.01) |
| G06F 1/16 | (2006.01) |
| H04M 9/00 | (2006.01) |
| H04B 1/3888 | (2015.01) |

(52) U.S. Cl.
CPC .................................... *H04B 1/3888* (2013.01)

(58) Field of Classification Search
CPC ...... A45C 13/002; A45C 11/00; A45C 13/36; A45F 5/00; G06F 1/1626; G06F 1/1656; G06F 1/1616; G06F 1/1633; H04B 1/3888; H01M 2/1066; H04M 1/0202; H04M 1/0214; H04M 1/0216; H04M 1/0252; H04M 1/026; H04M 1/0283; H04M 1/035; H04M 1/15; H04M 1/18; H04M 1/185; H05K 5/061; H05K 5/0013; H05K 5/0086; H05K 5/0217
USPC ............ 455/351, 556.1, 575.1, 575.3, 575.8; 206/320, 45.23; 340/539.1, 573.1; 361/679.01, 679.56, 679.58; 379/433.01, 447
See application file for complete search history.

(56) References Cited

U.S. PATENT DOCUMENTS

| | | | | |
|---|---|---|---|---|
| 5,613,237 | A * | 3/1997 | Bent et al. ..................... | 455/351 |
| 7,447,532 | B2 * | 11/2008 | Hsu ............................ | 455/575.8 |
| 8,204,561 | B2 * | 6/2012 | Mongan et al. ............. | 455/575.8 |
| 8,403,136 | B1 * | 3/2013 | Tsai ............................. | 206/320 |
| 2005/0164734 | A1 * | 7/2005 | Kakuguchi ......... | H04M 1/0214 455/556.1 |
| 2011/0228459 | A1 * | 9/2011 | Richardson ........... | H04M 1/185 361/679.01 |

(Continued)

*Primary Examiner* — Yuwen Pan
*Assistant Examiner* — Paul P Tran
(74) *Attorney, Agent, or Firm* — Ked & Associates, LLP

(57) ABSTRACT

There is disclosed a mobile terminal that is able to prevent failure in proper combination of elements that might be deformed when an external shock is applied to a corner of a mobile terminal, and an inner frame provided in a case of the mobile terminal and an inner frame provided in a case of the mobile terminal. A corner of the inner frame is exposed outside such that an external shock is applied to the corner of the mobile terminal can be delivered to the inner frame having a large rigidity to prevent deformation of the corner of the case. Accordingly, the deformation of the corner of the case may be reduced and durability and completeness of the mobile terminal can be enhanced.

14 Claims, 12 Drawing Sheets

(56) References Cited

U.S. PATENT DOCUMENTS

| | | | |
|---|---|---|---|
| 2012/0155035 A1* | 6/2012 | Chen | G06F 1/1626 361/728 |
| 2012/0314354 A1* | 12/2012 | Rayner | G06F 1/1656 361/679.01 |
| 2014/0076753 A1* | 3/2014 | Limber | H04B 1/3888 206/320 |

* cited by examiner

MOBILE TERMINAL AND INNER FRAME PROVIDED THEREIN

CROSS-REFERENCE TO RELATED APPLICATION(S)

Pursuant to 35 U.S.C. §119(a), this application claims the benefit of earlier filing date and right of priority to Korean Application No. 10-2012-0143278, filed on Dec. 11, 2012, the contents of which are hereby incorporated by reference herein in their entirety.

BACKGROUND OF THE DISCLOSURE

1. Field of the Disclosure

The present invention relates to a mobile terminal that is able to prevent failure in proper combination of elements that might be deformed when an external shock is applied to a corner of a mobile terminal, and an inner frame provided in a case of the mobile terminal.

2. Discussion of the Related Art

A mobile terminal is a device which may be configured to perform various functions. Examples of such functions include data and voice communications, capturing images and video via a camera, recording audio, playing music files and outputting music via a speaker system, and displaying images and video on a display. Some terminals include additional functionality which supports game playing, while other terminals are also configured as multimedia players. More recently, mobile terminals have been configured to receive broadcast and multicast signals which permit viewing of contents, such as videos and television programs.

Generally, terminals can be classified into mobile terminals and stationary terminals according to their degree (e.g., ease) of mobility. Further, the mobile terminals can be further classified into handheld terminals and vehicle mount terminals according to the manner of portability.

There are ongoing efforts to support and increase the functionality of mobile terminals. Such efforts include software and hardware improvements, as well as changes and improvements in the structural components which form the mobile terminal.

If a corner of such the mobile terminal is dropped to the floor prior to the other part of the mobile terminal, the corner of the mobile terminal might be immensely shocked. A case of the mobile terminal is typically formed of synthetic resin and a corner of the case might be deformed by the shock. In case the corner of the case is deformed, the case of the mobile terminal might not be combined completely only to deteriorate durability and complicity of the mobile terminal disadvantageously.

To solve such a disadvantage, the thickness of the corner of the case is increased or an auxiliary rib is formed in the corner of the case in the conventional mobile terminal.

However, as the thickness of the corner possessed by the case is increased, an overall thickness of a mobile terminal provided with the corner would be increased. Accordingly, it is restricted in a mobile terminal having a slim design to increase the thickness of a corner formed in a case of the mobile terminal to prevent the deformation of the corner. In addition, such a rib is formed of synthetic resin like a conventional case provided in the conventional mobile terminal. The rib formed of the synthetic rib has a weak rigidity and deformation of a corner still occurs disadvantageously.

SUMMARY OF THE DISCLOSURE

Accordingly, embodiments of the present invention are directed to a mobile terminal and a method of controlling the mobile terminal that substantially obviate one or more problems due to limitations and disadvantages of the related art.

The present invention is directed to a mobile terminal that substantially obviates one or more problems due to limitations and disadvantages of the related art. An object of the present invention is to provide a mobile terminal that includes a case having a structure capable of making up for the strength of a corner thereof, using an inner frame formed of a material having a high rigidity that is mounted in the case.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a mobile terminal includes a case configured to define an exterior appearance of the mobile terminal; an opening formed at least one corner of the case; and an inner frame provided in the case, the inner frame comprising at least one corner end exposed outside the case via the opening.

In another aspect of the present invention, an inner frame provided in a case of a mobile terminal includes a flat-plate-shaped panel coupled to the case; and a corner sidewall formed along an edge of at least one corner of the panel, wherein an outer surface of the corner sidewall is exposed outside the case of the mobile terminal.

Effects and/or advantages obtainable from the present invention are non-limited the above mentioned effect. And, other unmentioned effects and/or advantages can be clearly understood from the following description by those having ordinary skill in the technical field to which the present invention pertains.

It is to be understood that both the foregoing general description and the following detailed description of the preferred embodiments of the present invention are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this application, illustrate embodiment(s) of the invention and together with the description serve to explain the principle of the invention. The above and other aspects, features, and advantages of the present invention will become more apparent upon consideration of the following description of various embodiments, taken in conjunction with the accompanying drawing figures. In the drawings.

DESCRIPTION OF SPECIFIC EMBODIMENTS

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

As used herein, the suffixes 'module', 'unit' and 'part' are used for elements in order to facilitate the disclosure only. Therefore, significant meanings or roles are not given to the suffixes themselves and it is understood that the 'module', 'unit' and 'part' can be used together or interchangeably.

Features of embodiments of the present invention are applicable to various types of terminals. Examples of such terminals include mobile terminals, such as mobile phones, user equipment, smart phones, mobile computers, digital broadcast terminals, personal digital assistants, portable multimedia players (PMP) and navigators. However, by way of non-limiting example only, further description will be with regard to a mobile terminal 100, and it should be noted that such teachings may apply equally to other types of terminals such as digital TV, desktop computers and so on.

Figure 1:
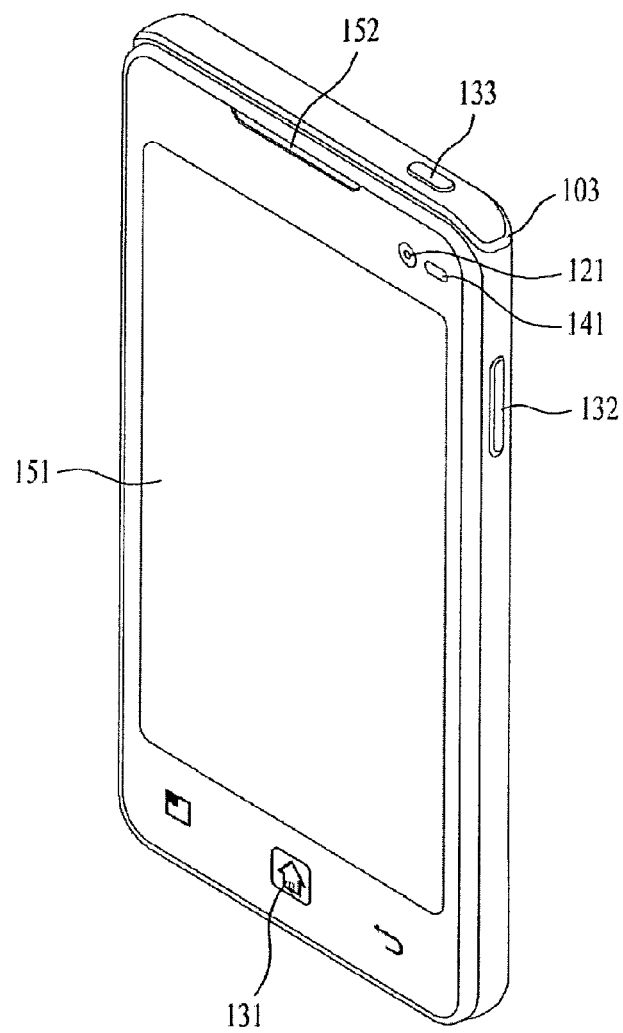
FIG. 1 is a front perspective diagram of a mobile terminal according to the embodiment of the present invention.

FIG. 1 is a front perspective diagram of a mobile terminal according to one embodiment of the present invention.

The mobile terminal 100 shown in the drawing has a bar type terminal body. Yet, the mobile terminal 100 may be implemented in a variety of different configurations. Examples of such configurations include folder-type, slide-type, rotational-type, swing-type and combinations thereof. For clarity, further disclosure will primarily relate to a bar-type mobile terminal 100. However such teachings apply equally to other types of mobile terminals.

Referring to FIG. 1, the mobile terminal 100 includes a case (101, 102) configuring an exterior thereof. In the present embodiment, the case can be divided into a front case 101 and a rear case 102. Various electric/electronic parts are loaded in a space provided between the front and rear cases 101 and 102.

However, the configuration of the case is not limited thereto. As shown in an embodiment of FIGS. 8 and 9, a case according to another embodiment may be configured of a front case 101, a rear case 102 and a side bezel 109 arranged between the front case 101 and the rear case 102.

Occasionally, electronic components can be mounted on a surface of the rear case 102. The electronic part mounted on the surface of the rear case 102 may include such a detachable part as a battery, a USIM card, a memory card and the like.

In doing so, the mobile terminal may further include a backside cover 103 configured to cover the surface of the rear case 102. In particular, the backside cover 103 has a detachable configuration for user's convenience. If the backside cover 103 is detached from the rear case 102, the surface of the rear case 102 is exposed.

Referring to FIG. 1, if the backside cover 103 is attached to the rear case 102, a lateral side of the rear case 102 may be exposed in part. If a size of the backside cover 103 is decreased, a rear side of the rear case 102 may be exposed in part. If the backside cover 103 covers the whole rear side of the rear case 102, it may include an opening 103' configured to expose a camera 121' or an audio output unit 152 externally.

The cases 101 and 102 and the backside cover 103 are formed by injection molding of synthetic resin or can be formed of metal substance such as stainless steel (STS), titanium (Ti) or the like for example.

A display 151, an audio output unit 152, a camera 121, user input units 130/131 and 132, a microphone 122, an interface 180 and the like can be provided to the case 101 or 102.

The display 151 occupies most of a main face of the front case 101. The audio output unit 152 and the camera 121 are provided to an area adjacent to one of both end portions of the display 151, while the user input unit 131 and the microphone 122 are provided to another area adjacent to the other end portion of the display 151. The user input unit 132 and the interface 170 can be provided to lateral sides of the front and rear cases 101 and 102.

The input unit 130 is manipulated to receive a command for controlling an operation of the terminal 100. And, the input unit 130 is able to include a plurality of manipulating units 131 and 132. The manipulating units 131 and 132 can be named a manipulating portion and may adopt any mechanism of a tactile manner that enables a user to perform a manipulation action by experiencing a tactile feeling.

Content inputted by the first or second manipulating unit 131 or 132 can be diversely set. For instance, such a command as start, end, scroll and the like is inputted to the first manipulating unit 131. And, a command for a volume adjustment of sound outputted from the audio output unit 152 and the like can be inputted to the second manipulating unit 132, a command for a switching to a touch recognizing mode of the display 151 and the like can be inputted to the second manipulating unit 133.

FIG. 1 is a perspective diagram of a backside of the terminal shown in FIG. 1.

Figure 2:
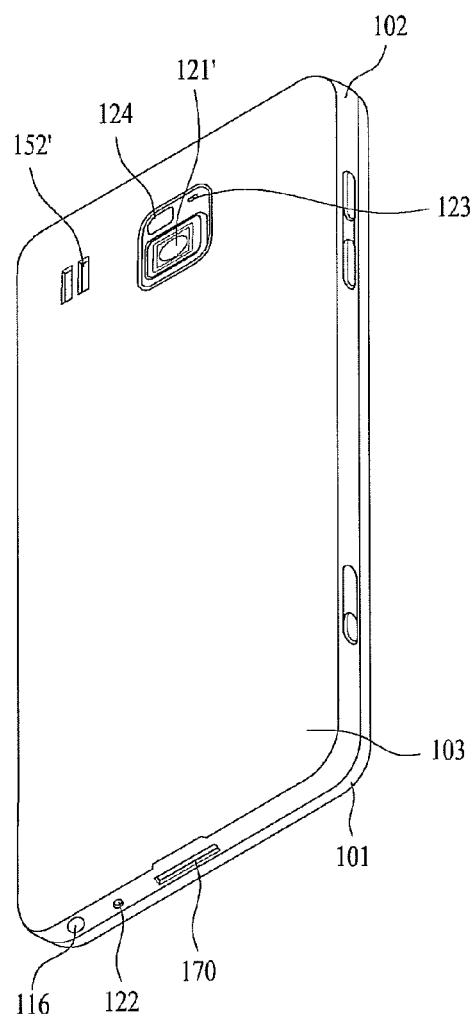
FIG. 2 is a rear perspective diagram of a mobile terminal according to one embodiment of the present invention.

Referring to FIG. 2, a camera 121' can be additionally provided to a backside of the terminal body, and more particularly, to the rear case 102. The camera 121 has a photographing direction that is substantially opposite to that of the former camera 121 shown in FIG. 1 and may have pixels differing from those of the firmer camera 121.

Preferably, for instance, the former camera 121 has low pixels enough to capture and transmit a picture of user's face for a video call, while the latter camera 121' has high pixels for capturing a general subject for photography without transmitting the captured subject. And, each of the cameras 121 and 121' can be installed at the terminal body to be rotated or popped up.

A flash 123 and a mirror 124 are additionally provided adjacent to the camera 121'. The flash 123 projects light toward a subject in case of photographing the subject using the camera 121'. In case that a user attempts to take a picture of the user (self-photography) using the camera 121', the mirror 124 enables the user to view user's face reflected by the mirror 124.

An additional audio output unit 152' can be provided to the backside of the terminal body. The additional audio output unit 152' is able to implement a stereo function together with the former audio output unit 152 shown in FIG. 2A and may be used for implementation of a speakerphone mode in talking over the terminal.

A broadcast signal receiving antenna 116 can be additionally provided to the lateral side of the terminal body as well as an antenna for communication or the like. The antenna 116 constructing a portion of the broadcast receiving module 111 shown in FIG. 1 can be retractably provided to the terminal body.

Figure 3:
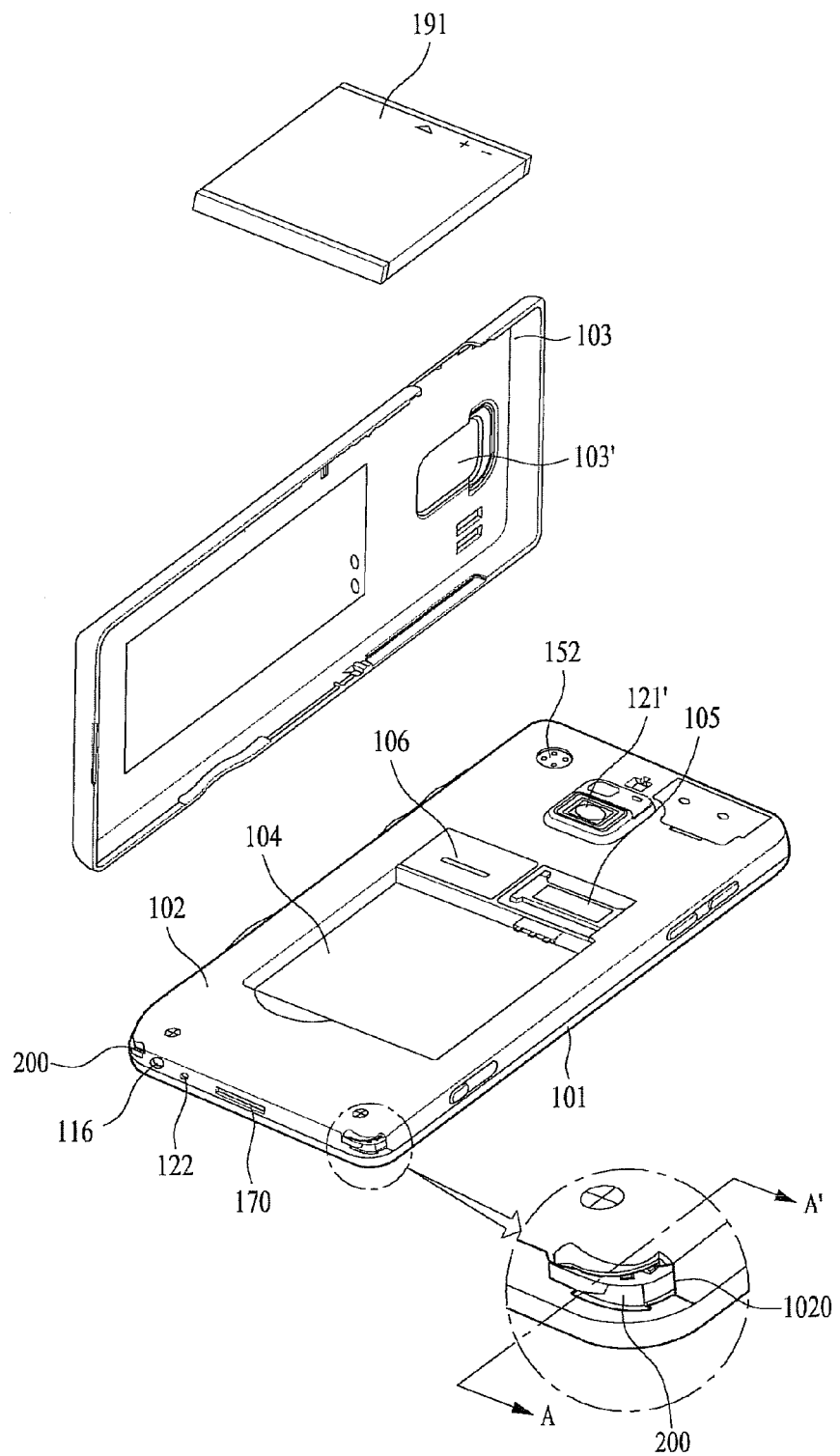
FIG. 3 is a perspective diagram of a mobile terminal according to one embodiment of the present invention, in which a backside cover detached from a backside of the mobile terminal is shown.

FIG. 3 is a perspective diagram of a mobile terminal according to one embodiment of the present invention, in which a backside cover detached from a backside of the mobile terminal. Referring to FIG. 3 there may be shown a front case 101, a rear case 102, a back cover (or a battery cover) 103, a camera 121', an interface 170, a microphone 122, an audio output unit 152, a battery 191, a battery loading part 104, a USIM card loading part 105 and a memory card loading part 106. As shown in the drawing, the front case 101 and the rear case 102 may define a body of the mobile terminal. The back cover 103 may be detachably coupled to a back side of the mobile terminal body.

In a back side of the rear case 102 may be provided a predetermined space where external components such as the battery loading part 104, the USIM card loading part 105 and the memory card loading part 106 can be mounted. Typically, such external components mounted in the surface of the rear case 102 are configured to expand various functions of the mobile terminal to meet various consumers' demands.

Figure 4:
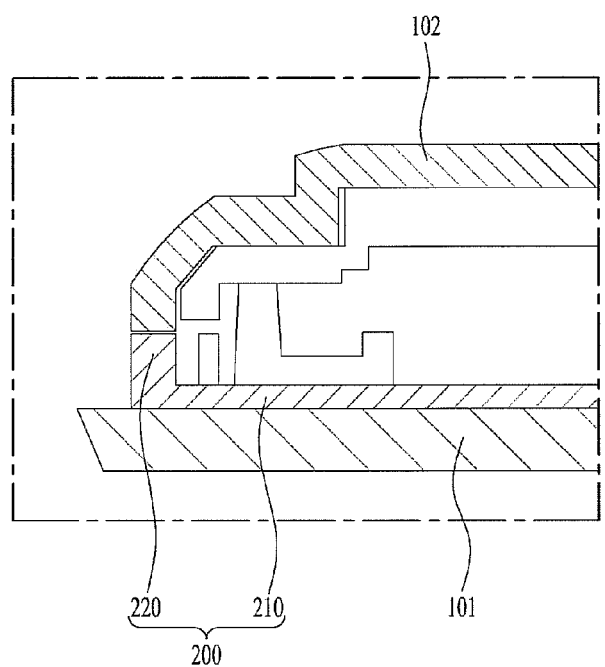
FIG. 4 is a sectional diagram of a body of the mobile terminal according to the embodiment shown in FIG. 3, cut-away along A-A'.

As shown in FIG. 4, the battery 191 may be a replaceable type to make up for a defect of large power consumption generated as the functions of the mobile terminal are versatile. In case of a replaceable type battery, the battery loading part 104 is formed in a surface of the rear case 102 to allow the battery replaced by the user. A connection terminal may be provided in the battery loading part 104 to be electrically connected with components mounted in the case.

As shown in FIG. 3, the USIM card loading part 105 or the memory card loading part 106 may be formed next to the battery loading part 104 or in a bottom surface of the battery loading part 104, such that they can be exposed outside when the battery 191 is removed from the battery loading part 104. In this instance, the size of the battery loading part 104 can be increased to increase the size of the battery 191.

It is shown in FIG. 3 that the USIM card loading part 105 and the memory card loading part 106 are mounted in a rear surface of the rear case 102. In another aspect of the present invention, those components may be separably inserted in the mobile terminal.

The back cover 103 is configured to cover the surface of the rear case 102 in order to fixedly secure the battery 191, a USIM card and a memory card mounted in the surface of the rear case 102. Also, the back cover 103 may be configured to protect the external components from an external shock or foreign substances. Recently, the back cover 103 may be additionally provided with a waterproof function to have a waterproof structure (not shown) configured to make the rear case 102 and the back cover coupled to each other airtight in order to prevent water from penetrating to the external components.

Figure 5:
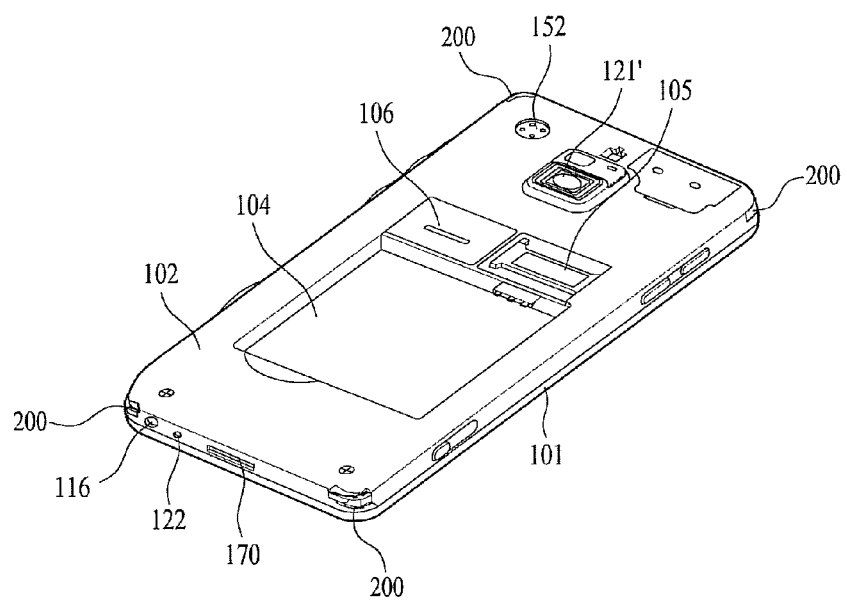
FIG. 5 is a rear perspective diagram illustrating a body of a mobile terminal according to another embodiment of the present invention.

Referring to FIGS. 3 and 5, a detailed structure of the mobile terminal body according to one embodiment of the present invention will be described as follows.

Referring to FIG. 3 again, one embodiment of the mobile terminal body according to the present invention is shown in a partially exploded perspective view. As shown in FIG. 3, an opening 1020 is formed in at least one corner of the case provided in the mobile terminal according to this embodiment of the present invention. An inner frame 200 is provided in the case and an end of at least one corner possessed by the inner frame 200 is exposed outside via the opening 1020. It is preferred that the inner frame 200 is formed of a predetermined material having a larger rigidity, compared with the synthetic resin used in forming the case.

The inner frame 200 may be arranged in the case at a predetermined height proper to be exposed outside the case via the opening 1020. In case the case is configured of the front case 101 and the rear case 102, the inner frame 200 may be arranged in the rear case 102, on the same plane. It is preferred that a corner of the inner frame 200 is exposed at the opening 1020, only to be substantially on the same plane with an outer surface of the rear case 102.

FIG. 4 is a sectional diagram of the corner of the mobile terminal body shown in FIG. 3, cut-away along A-A'.

As shown in FIG. 4, the end of the corner possessed by the inner frame 200 is inserted in the opening 1020 formed in the case, to be exposed outside the case 201 via the opening 1020. In addition, the end of the corner of the inner frame exposed outside the case may be on the same plane with an outer surface of the case 102. In this case, a corner portion of the case may be replaced with the inner frame 200 in order not to be projected or recessed in an entire exterior appearance of the case.

According to one embodiment, the inner frame 200 may be a flat frame that supports the display module mounted in the case of the mobile terminal, in contact with a back side of the display module. The inner frame 200 may be formed of a predetermined material having a larger rigidity than the material of the case, to protect the display module from an external shock. For example, a predetermined portion of the inner frame 200 may be formed of a high stiffness synthetic resin material containing 50% of glass fiber. The end of the corner exposed outside the case may be formed of such high stiffness synthetic resin.

According to the present invention, the inner frame 200 is exposed outside the corner of the case provided in the mobile terminal. An external shock applied to a corner of the mobile terminal body could be delivered to the corner of the inner frame 200, not to the case. At this time, the inner frame 200 is formed of a relatively high stiffness material and it can maintain an original shape thereof even against an immense shock.

In other words, the end of the corner possessed by the inner frame 200 forms the corner of the mobile terminal body in the mobile terminal according to the present invention, such that the rigidity of the corner can be made up for. Accordingly, even when an immense shock is applied to the corner of the mobile terminal body, the case of the mobile terminal can maintain the original shape and the case may be prevented from deformation that might generate failure in a mold combination structure of the case.

According to one embodiment, as shown in FIG. 3, ends of the corners possessed by the inner frame 200 may be exposed from both lower corner portions of the case, respectively. When the user misses the mobile terminal in the middle of using the mobile terminal, it is likely that a large shock is applied to lower corners of the mobile terminal body. In case both lower corners of the mobile terminal body are formed of ends of the inner frame 200 as shown in FIG. 3, it can be prevented efficiently that the shape of the case is deformed by the falling of the mobile terminal while using it.

According to another embodiment, ends of corners possessed by the inner frame 200 may be exposed to four corners of the case. FIG. 5 shows a body of the mobile terminal according to this embodiment.

As shown in FIG. 5, ends of corners possessed by the inner frame 200 may be exposed to both lower corners of the case, respectively, and both upper corners of the case, respectively. In this case, the deformation of the case generated by the external shock can be prevented, regardless of which one the external shock is applied to out of corners possessed by the mobile terminal.

In following drawings is shown the detailed structure of the inner frame and the case according to the embodiment in that the corner ends of the inner frame are exposed only to both lower corners of the case. However, the present invention is not limited thereto. According to which corner of the mobile terminal body the corner ends of the inner frame are exposed to, the number of elements composing the inner frame and the case, respectively, may be increased and the position of each element may be changed.

Referring to FIGS. 6 to 11, detailed shapes and structures of an inner frame and a case provided in a mobile terminal according to various embodiments of the present invention will be described as follows.

Figure 6:
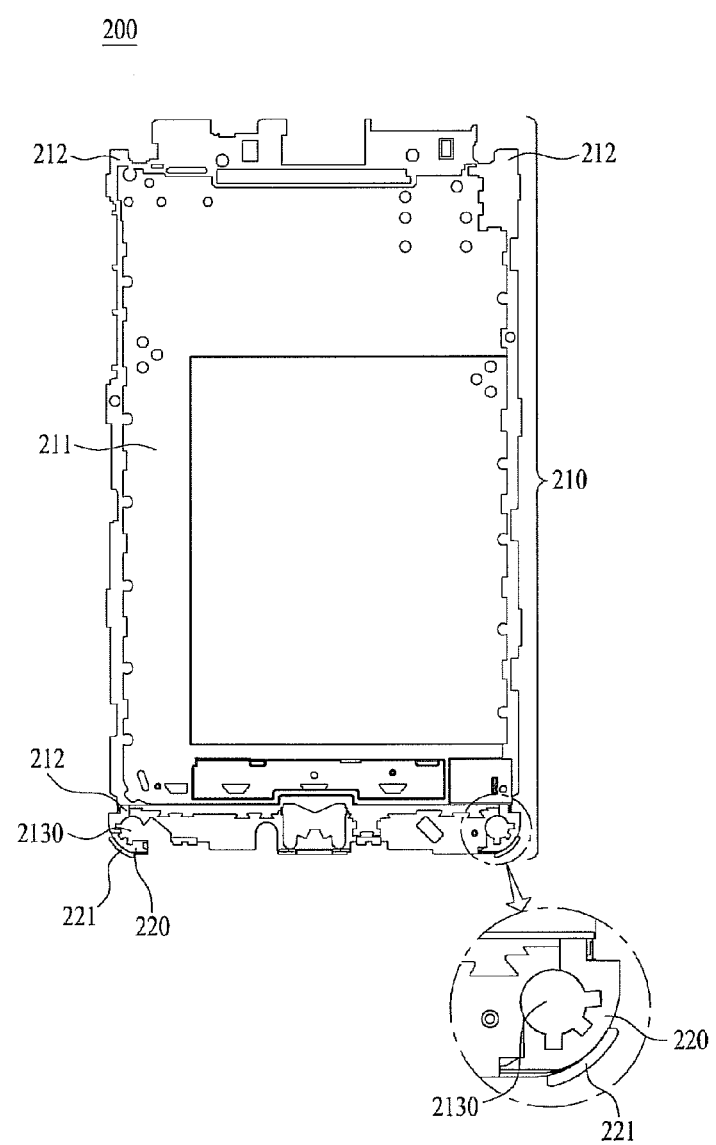
FIG. 6 is a plane diagram of an inner frame provided in the mobile terminal according to one embodiment of the present invention.

FIG. 6 shows an embodiment of an inner frame provided in a mobile terminal. As shown in FIG. 6, the inner frame may include a panel and a corner sidewall formed in a corner of the panel.

The panel 210 may be plate-shaped and a shape of a corner possessed by the panel 210 may be formed corresponding to a shape of an inner shape of a corner possessed by the case. In other words, the shape of the corner possessed by the panel may be similar to the shape of the inner surface possessed by the corner of the case so as that the corner of the panel 210 can contact the inner surface of the case or be spaced apart a predetermined distance from the inner surface of the case, in parallel. As one of examples, a corner end of the panel 210 may form a curve and the curve may be combined with a curved surface formed in the inner surface of the corner possessed by the case.

In case the inner frame 200 is configured to support the display module, one surface of the panel may contact with a rear surface of the display module. At this time, an accommodating part may be formed in the other surface of the panel 210 to accommodate various electronic components. For example, the battery loading part (104, see FIG. 3) in which the battery is loaded may be formed in the other surface of the panel 210. A graphite sheet for heat radiation of the display module may be provided in one surface of the inner frame 200.

The corner sidewall 220 may be formed along an edge of at least one corner possessed by the panel 210. As one of examples, as shown in FIG. 6, the corner sidewall 220 may be formed in an edge of each of both lower corners possessed by the panel 210. As another one of examples, the corner sidewall 220 may be formed in each of fourth corner edges possessed by the panel 210. As shown in FIG. 6, in case an edge of the corner possessed by the panel 210 forms a curve, the corner sidewall 220 may be projected from one surface of the panel 210 and extended along the curve. As the corner sidewall 220 is formed along the corner edge of the panel 210, an outer surface of the corner sidewall 220 may form an end of a corner possessed by the inner frame 220.

According to this embodiment, the corner sidewall 220 is inserted in the opening 1020 of the case. Accordingly, the corner end of the inner frame 200 may be exposed outside the case. It is shown in FIG. 4 that the corner sidewall 220 is inserted in the opening 1020 of the case. According to one embodiment, once the corner sidewall 220 is inserted in the opening 1020 of the case, the outer surface of the corner sidewall 220 and an outer surface of the case may substantially be on the same plane. In this instance, a corner portion of the case can be replaced with the inner frame 200 in order to prevent the corner portion from being projected or recessed from the entire exterior appearance of the case as mentioned above.

The exposed end of the corner possessed by the inner frame 200 is configured of the corner sidewall 220 such that a surface area of the exposed end may be enlarged. If the corner of the panel 210 is exposed without the corner sidewall 220, an external shock applied to the end of the inner frame 200 is concentrated on the surface area of the thin panel 210. When the corner sidewall is formed in the edge according to this embodiment, the outer surface of the corner sidewall 220 has a larger area than a section area of the panel 210 and the shock applied to the corner of the inner frame 200 can be dispersed. Accordingly, the corner sidewall 220 may be used in making up for the rigidity of the corner possessed by the mobile terminal body more effectively.

According to one embodiment, as shown in FIG. 6, the panel 210 may include a flat plate 211 and a coupling portion 212. The flat plate 211 may be injection-molded and mainly contact with the display module in case the inner frame 200 is configured to support the display module.

The coupling portion 212 may be formed in an end of the flat plate 211 and it may be formed of a predetermined material that is different from a material used in forming the flat plate 211. One or more holes 2030 may be formed in the coupling portion 212 and a screw for the assembling of the case may be inserted in the hole 2130. As shown in FIG. 6, coupling portions 212 may be formed in one lower end and both upper ends of the flat plate 211, respectively. Optionally, the coupling portions 212 may be formed in one lower end and one upper end of the flat plate 211, respectively, or in both lower ends and both upper ends, respectively. According to one embodiment, the coupling portion 212 may be formed of high stiffness synthetic resin containing 50% of glass fiber.

The coupling portion 212 may be formed in the end of the flat plate 211 to form at least one corner of the panel 210. In this instance, a corner of the coupling portion 212 may be configured as the corner of the inner frame 200. In addition, the corner sidewall 220 may be projected from the coupling portion 212 along an edge of the corner of the coupling portion 212, to form the end of the corner of the panel 210. As one example, as shown in FIG. 6, the corner sidewall 220 may be formed in a curved shape to cover an outer circumference of the hole 2130 where the screw for the assembling of the case is inserted. In this instance, the corner sidewall 220 may form the end of the corner of the inner frame, such that it may be inserted in the opening 1020 of the case to be exposed outside and to support the screw inserted in the hole 2130 simultaneously.

According to one embodiment, the coupling portion 212 and the flat plate 211 may be double-injection-molded. For that, one of the flat plate 211 and the coupling portion 212 is injection-molded firstly and the other one is injection-molded on the injection mold. In this instance, the flat plate 211 and the coupling portion 212 formed of different materials may be coupled to each other securely, only to form an integrally formed panel 210. Accordingly, the entire rigidity of the inner frame can be more enhanced.

According to the embodiment mentioned above, the flat plate and the coupling portion 212 that compose the panel 210 are formed of optimized materials for functions, such that the panel 210 of the inner frame can be functioned efficiently. At the same time, the inner frame 200 can be assembled in the case via the hole 2130 securely and the durability of the mobile terminal body can be enhanced accordingly.

Figure 7:
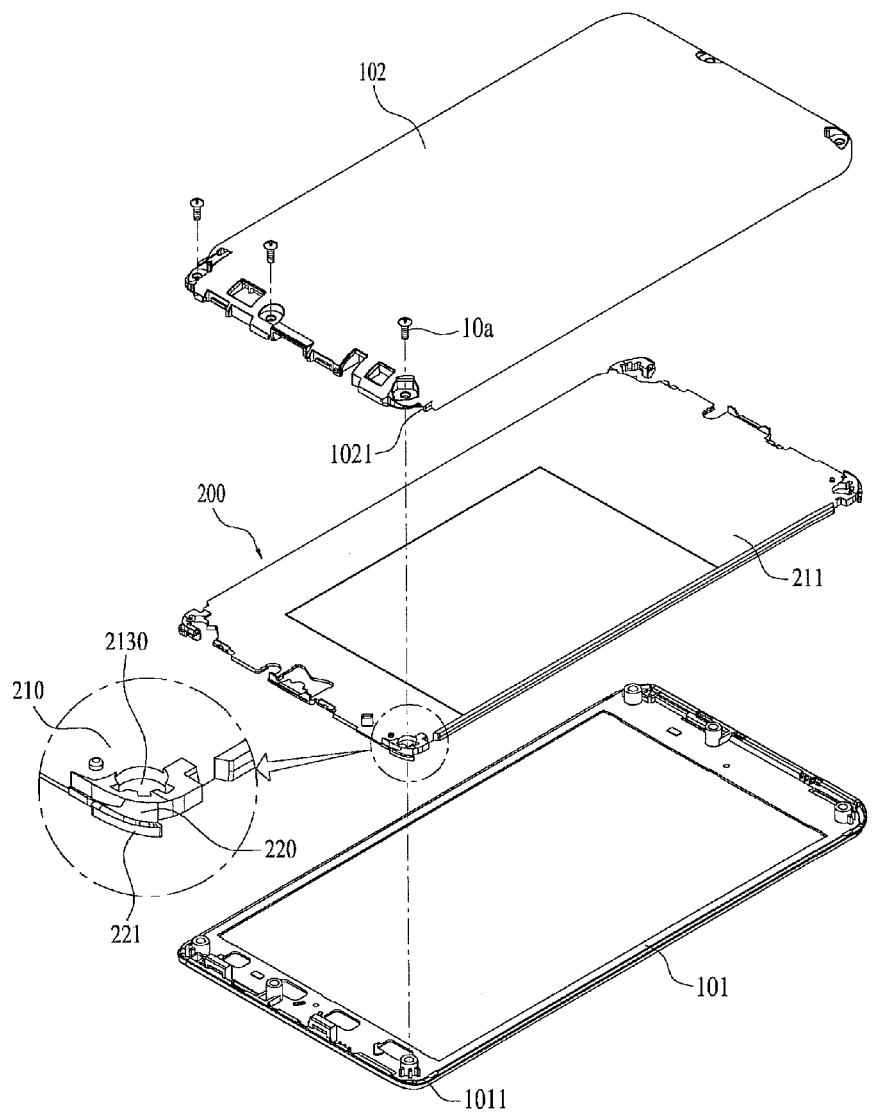
FIG. 7 is an exploded perspective view of a front case, an inner frame and a rear case cut-away from the mobile terminal according to one embodiment of the present invention.

FIG. 7 is an exploded perspective diagram illustrating a coupling relation between the inner frame shown in FIG. 6 with the front case and the rear case.

According to one embodiment, as shown in FIG. 7, the case of the mobile terminal may be configured of a front case 101 and a rear case 102. As mentioned above, the front case 101 may define a front appearance of the mobile terminal body and the rear case 102 may be coupled to a back side of the front case 101 to define a back appearance of the mobile terminal body.

As shown in FIG. 7, the inner frame 200 may be arranged in a back side of the front case 101 and the front case 101 and the rear case 102 may be assembled to each other in a state where the rear case 102 is arranged in the back surface of the inner frame 200. In case the hole 2130 is formed in the panel 210 of the inner frame 200 according to the embodiment mentioned above, a screw 10a for assembling the front case 101 and the rear case 102 to each other may be inserted in the hole 2130. As the screw 10a is inserted in the hole 2130 of the inner frame 200, the position of the inner frame 200 may be fixed in a gap formed between the front case 101 and the rear case 102.

As shown in FIG. 7, in case the case of the mobile terminal according to this embodiment is configured of the front case 101 and the rear case 102, a recess 1021 may be formed in a corner of the rear case 102. The recess 1021 may form the opening 1020 in the case of the mobile terminal when the rear case 102 is coupled to the front case 101. An edge portion of a corner possessed by the rear case is recessed to form the recess 1021. In other words, a sidewall of the rear case 102 that forms a side of the rear case may be recessed to form the recess 1021.

In this instance, when the front case 101, the inner frame 200 and the rear case 102 are coupled to each other, the corner sidewall 220 formed in the panel 210 of the inner frame 200 may be inserted in the recess 1021. Accordingly, an outer surface of the corner sidewall 220 may be exposed outside the rear case 102 and it is preferred that the outer surface of the corner sidewall 220 and an outer surface of the rear case 102 are substantially on the same plane.

FIG. 7 shows that the recess 1021 is formed in each of both lower corners of the rear case 102. According to another embodiment, the recess 1021 may be further formed in each of both upper corners of the rear case 102. The position of the recess 2021 may be variable according to which corner of the inner frame 200 the corner sidewall 220 of the inner frame 200 is formed in. it is preferred that the recess 2021 is formed in the corner of the rear case 102, corresponding to the corner sidewall 220 of the inner frame 200.

Figure 8:
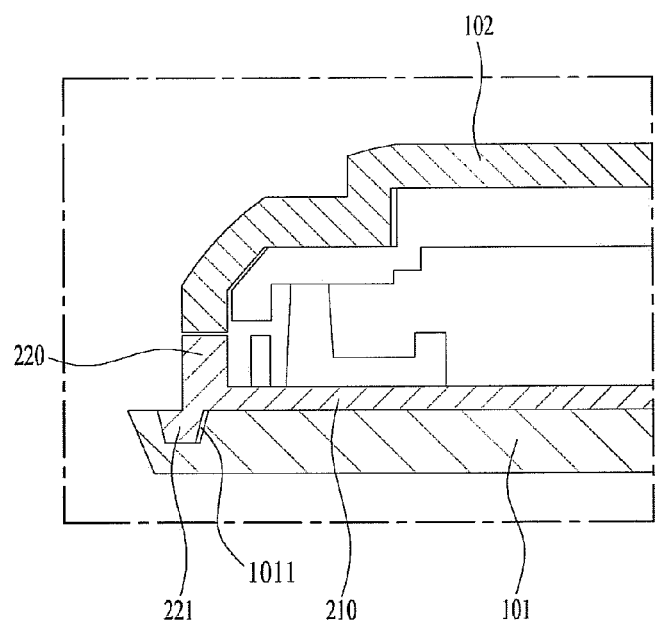
FIG. 8 is a sectional diagram illustrating the body of the mobile terminal according to the embodiment shown in FIG. 7, cut-away along A-A' shown in FIG. 3.

Meanwhile, FIG. 8 shows a sectional diagram of a corner possessed by a mobile terminal body according to another embodiment of the present invention.

According to this embodiment, a corner protrusion 221 may be further formed in the inner frame 200. Such a corner protrusion 221 may be projected from an outer surface of the corner sidewall 220 to be extended along the corner sidewall 220 and a predetermined portion of the corner protrusion 221 may be projected in the opposite direction with respect to a projection direction of the corner sidewall 220 simultaneously. As shown in enlarged views of FIGS. 6 and 7, the corner protrusion 221 is projected from the corner sidewall 220 in an outward direction and projected in the opposite direction with respect to the projection direction of the corner sidewall 220 as shown in FIG. 8 simultaneously.

At this time, when the inner frame 200 is mounted in the case, the corner protrusion 221 may be inserted in a corner retaining groove 1011 formed in the case as shown in FIG. 8. An inner surface of the corner possessed by the case may be recessed to form the corner retaining groove 1011. As shown in FIG. 7, the corner retaining groove 1011 may be formed in an inner surface of the front case 101. The corner retaining groove 1011 may be recessed from the inner surface of the front case 101 in an outward direction, corresponding to the shape of the corner protrusion 221. In a state where the corner protrusion 221 is inserted in the corner retaining groove 1011, the inner frame 200 may be assembled to the front case 101 and the rear case 102.

In this embodiment, as shown in FIG. 7, the corner retaining groove 1011 may be formed in each of both lower corners of the front case 101. Optionally, the corner retaining groove 1011 may be further formed in each of both upper corners possessed by the front case.

The position of the corner retaining groove 1011 may be differentiated by which corner of the inner frame 200 the corner sidewall 220 and the corner protrusion 221 of the inner frame 200 are formed. It is preferred that the corner retaining groove 1011 is formed in the corresponding corner of the case to the corner sidewall 220 and the corner protrusion 221 formed n the inner frame 200. As the corner protrusion 221 projected from the corner sidewall 220 is inserted in the corner retaining groove 1011 formed in the case, the corner sidewall 220 may be fixed stably. In other words, the corner protrusion 221 is inserted in the corner retaining groove 1011, to prevent deformation of the corner sidewall 220 or movement of the corner sidewall 220 into the case secondarily. The corner protrusion 221 is projected from the corner sidewall 220 in two directions (a height direction and a lateral direction of the corner sidewall 220) such that the corner sidewall 220 may be fixed in diversified positions.

Figure 9:
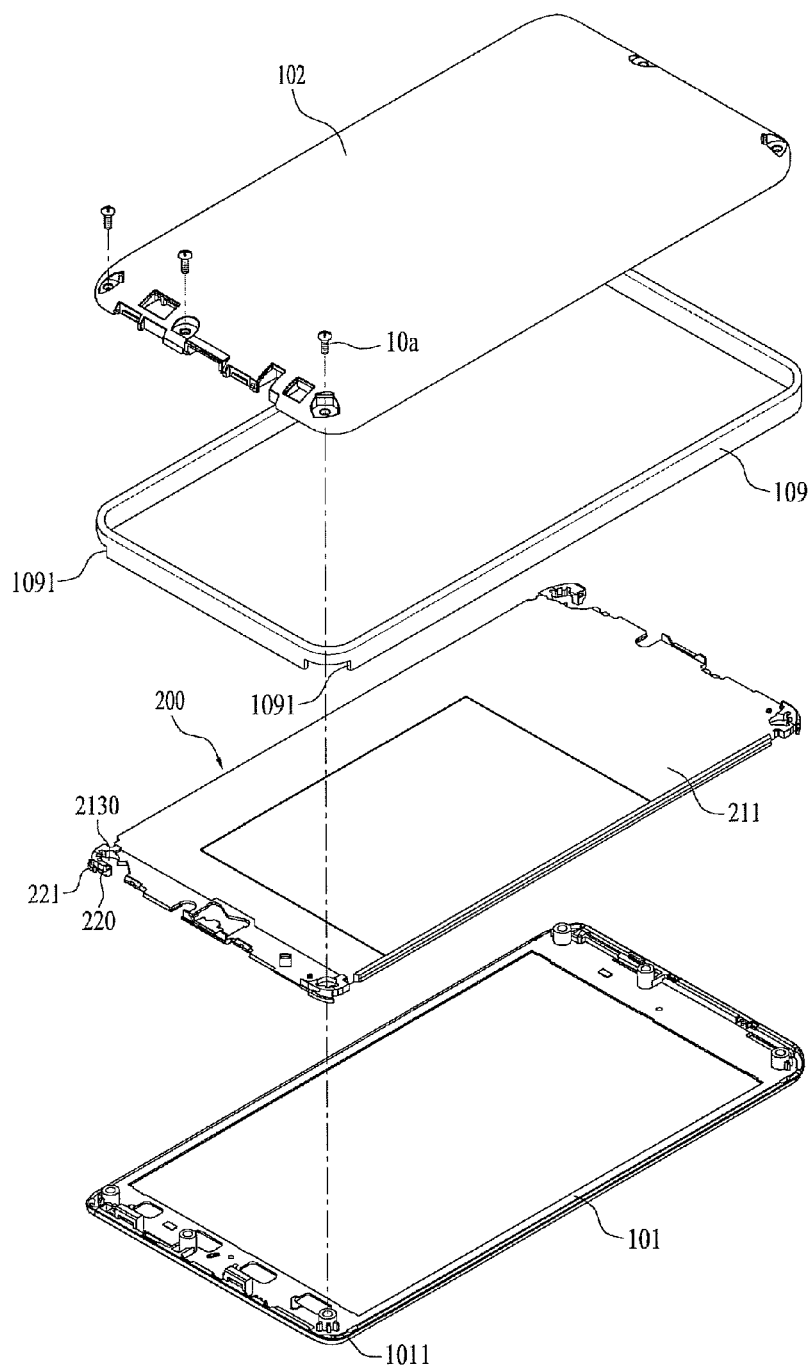
FIG. 9 is an exploded perspective diagram of a front case, an inner frame, a side bezel and a rear case cut-way from a mobile terminal according to a further embodiment of the present invention.
Figure 10:
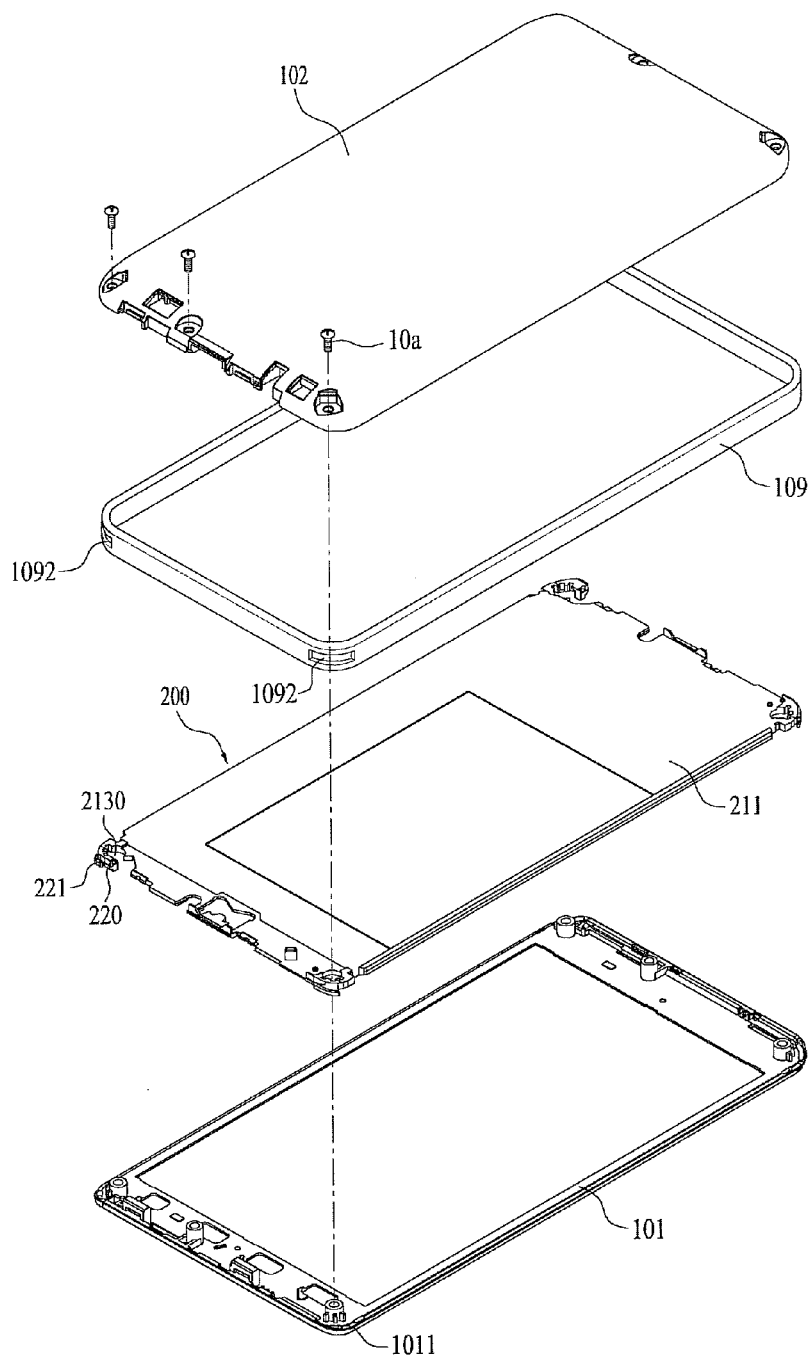
FIG. 10 is an exploded perspective diagram of a front case, an inner frame, a side bezel and a rear case provided in a mobile terminal according to a still further embodiment of the present invention.

FIG. 9 is an exploded perspective diagram illustrating a coupling relationship among the inner frame and the front case shown in FIG. 6, a side bezel according to one embodiment and the rear case. FIG. 10 is an exploded perspective diagram illustrating a coupling relation among the inner frame and the front case shown in FIG. 6, a side bezel according to another embodiment and the rear case.

According to one embodiment, as shown in FIGS. 9 and 10, a case of a mobile terminal may be configured of a front case 101, a size bezel 109 and a rear case 102. In this instance, the side bezel 109 may define a side exterior appearance of the mobile terminal. The front case 101 and the rear case 102 may define a front appearance and a rear appearance of the mobile terminal, respectively. The rear case 102 may be coupled to the other side of the side bezel 109.

As shown in FIG. 9, in case the case of the mobile terminal is configured of the front case 101, the side bezel 109 and the rear case 102, a recess 1091 may be formed in a corner of the side bezel 109. An edge of the corner of the side bezel 109 is recessed to form the recess 1091. When the front case 101, the side bezel 109 and the rear case 102 are coupled to each other, the recess 1091 may form the opening 1020 of the case and a corner sidewall 220 formed in a panel 210 of an inner frame 200 may be inserted in the recess 1091 to be exposed outside the side bezel 109. It is preferred that an outer surface of the corner sidewall 220 and an outer surface of the side bezel 109 are substantially on the same plane.

Alternatively, as shown in FIG. 10, a penetrating hole 1092 may be formed in a corner of the side bezel 109. The penetrating hole 1092 is penetrating a corner of the side bezel 109 and it may form the opening 1020 in the case of the mobile terminal when the front case 101, the side bezel 109 and the rear case 102 are coupled to each other. As it is inserted in the penetrating hole 1092, the corner sidewall 220 formed in the panel 210 of the inner frame 200 may be exposed outside the side bezel 109. It is preferred that an outer surface of the corner sidewall 220 and an outer surface of the side bezel 109 are substantially on the same plane.

As shown in FIGS. 9 and 10, the recess 1091 or the penetrating hole 1092 may be formed in both lower corners of the side bezel 109, respectively. The recess 1091 or the penetrating hole 1092 may be further formed in both upper corners of the side bezel 109, respectively. The position of the recess 1091 or the penetrating hole 1092 may be differentiated according to which corner of the inner frame 200 the corner sidewall 220 of the inner frame 200 is formed in and it is preferred that the recess 1091 or the penetrating hole 1092 is formed in the corner of the side bezel 109 corresponding to the corner sidewall 220 formed in the inner frame 200.

Figure 11:
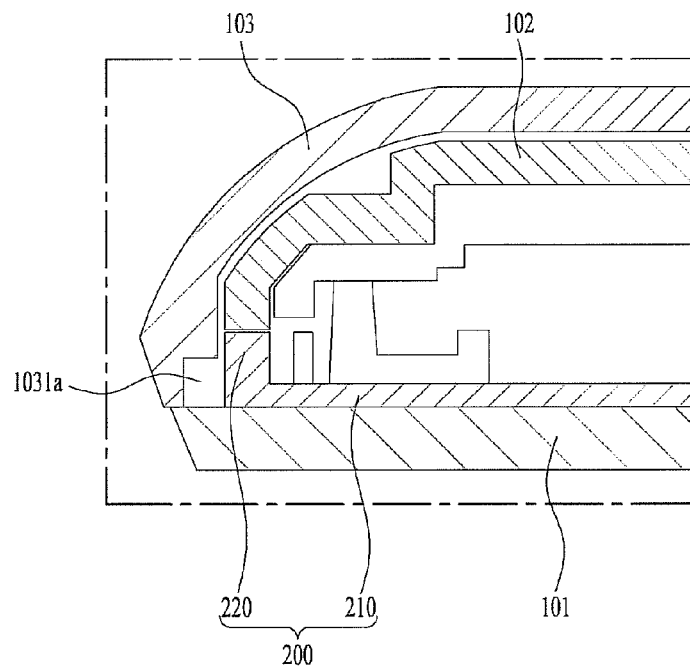
FIG. 11 is a sectional diagram of a body to which a back cover of the mobile terminal according to one embodiment is coupled, cut-away along A-A' shown in FIG. 3.
Figure 12:
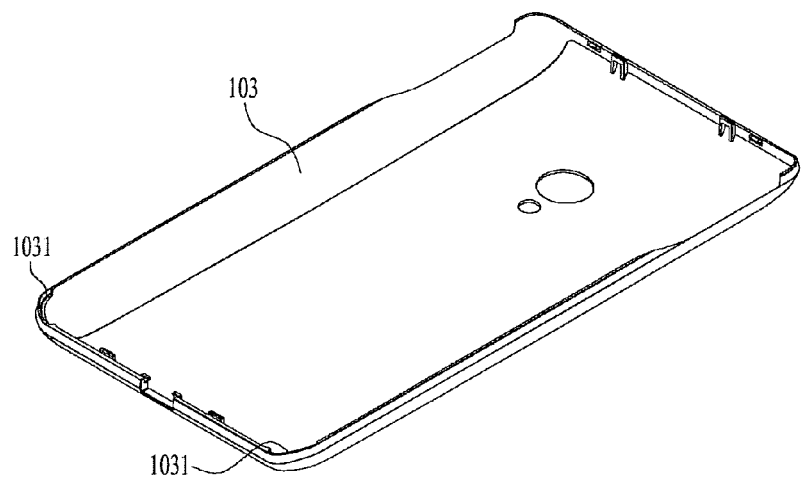
FIG. 12 is a perspective diagram of the back cover provided in the mobile terminal according to one embodiment of the present invention.
Figure 13:
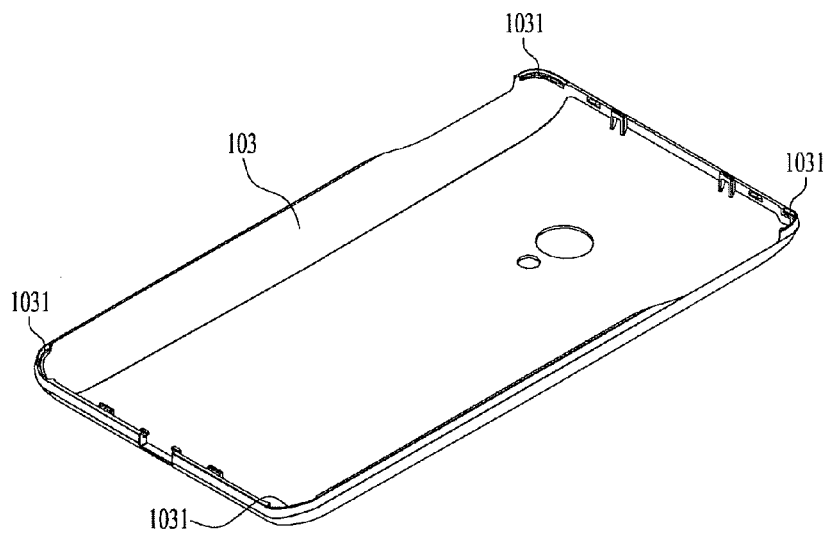
FIG. 13 is a perspective diagram of a back cover provided in the mobile terminal according to another embodiment of the present invention.

Referring to FIGS. 11 to 13, a detailed appearance or structure of a back cover provided in a mobile terminal according to a further embodiment of the present invention will be described as follows.

FIG. 11 is a sectional diagram of a corner possessed by a mobile terminal having a back cover coupled thereto according to this embodiment. FIG. 12 is a perspective diagram of the back cover.

As shown in FIG. 11, the mobile terminal according to the present invention may further include a back cover 103 detachably coupled to a rear surface of the case. At this time, according to this embodiment, a gap 1031a may be formed between a corner of the case and an inner surface of the back cover 103 when the back cover 103 is coupled to the case.

As one example, the gap 1031a may be formed in an end of the corner of the inner frame 200 exposed outside the case and the inner surface of the back cover 103. If the corner sidewall 220 is formed in the panel 210 of the inner frame 200, with one surface thereof being exposed outside the case, the gap 1031a may be formed between an outer surface of the corner sidewall 220 and an inner surface of the back cover 103 as shown in FIG. 11. As the inner frame 200 is exposed outside the case via the corner of the case, the gap 1031a may be formed in the corner of the back cover 103.

As another example, the gap 1031a may be formed in an outer surface of the case and an inner surface of the back cover 103. In this instance, a predetermined portion of the inner frame 200 is not exposed outside via the corner of the case. Even at this time, the gap 1031a may be formed in the corner of the back cover 103.

As the gap 1031a is formed between the corner of the case and the inner surface of the back cover 103, the back cover 103 may be combined to the rear case 102 even if the corner of the back cover 103 is deformed by a shock applied thereto.

In case the corner of the back cover 103 is deformed inward, the deformed corner of the back cover 103 may be positioned in the gap 1031a when the back cover 103 is coupled to the case of the mobile terminal. The front case 101 is forcedly inserted in the gap 1031a and no further gap is formed between the back cover 103 and the case. Even how the corner of the back cover 103 is deformed by falling of the mobile terminal, the mobile terminal can be assembled in a proper mold combination structure. Accordingly, the quality and completeness of the mobile terminal may be enhanced.

According to one embodiment, as shown in FIG. 12, the gap 1031a may be formed by a shock absorbing groove formed in a corner of the back cover 103. An inner surface of the back cover 103 may be recessed along an edge of at least one corner possessed by the back cover 103, to form the shock absorbing groove 1031. In other words, the shock absorbing groove 1031 may be recessed from an inner surface of the back cover 103 outward, to be extended along the edge of the corner possessed by the back cover 103.

As shown in FIG. 12, the shock absorbing groove 1031 may be formed in each of both lower corners possessed by the back cover 103. It is preferred that the shock absorbing groove 1031 is formed in the corner of the back cover 103 where an end of the corner of the inner frame 200 exposed outside the case is accommodated. In this instance, the corner rigidity supplement enabled by the end of the corner exposed outside the case and the deformation absorber effect enabled by the shock absorbing groove can be realized simultaneously.

FIG. 13 is a perspective view of a back cover provided in a mobile terminal according to a further embodiment. As shown in FIG. 13, shock absorbing grooves 1031 may be formed in four corners of a back cover 103, respectively. in this instance, the deformation absorption for the back cover 103 enabled by the shock absorbing grooves 1031 may be realized at all of the four corners of the back cover 103. Even when an external shock is applied to any one of the corners of the back cover 103, the back cover 103 can be coupled to the case of the mobile terminal in the proper combination mold structure and the quality of the mobile terminal can be improved.

Various variations and modifications are possible in the component parts and/or arrangements of the subject combination arrangement within the scope of the disclosure, the drawings and the appended claims.

Although embodiments have been described with reference to a number of illustrative embodiments thereof, it should be understood that numerous other modifications and embodiments can be devised by those skilled in the art that will fall within the spirit and scope of the principles of this disclosure.

It will be apparent to those skilled in the art that the present invention can be specified into other form(s) without departing from the spirit or scope of the inventions.

In addition, the above-described methods can be implemented in a program recorded medium as computer-readable codes. The computer-readable media include all kinds of recording devices in which data readable by a computer system are stored. The computer-readable media include ROM, RAM, CD-ROM, magnetic tapes, floppy discs, optical data storage devices, and the like for example and also include carrier-wave type implementations (e.g., transmission via Internet). And, the computer can include the control unit 180 of the terminal.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A mobile terminal to provide wireless communication comprising:
    a case to define at least a portion of an exterior of the mobile terminal, the case including an opening at one corner portion of the case; and
    a display module provided in front of the case;
    an inner frame provided at the case, and the inner frame contacts a rear surface of the display module, the inner frame including at least one corner end exposed via the opening of the case,
    wherein the inner frame has a larger rigidity than the case, and
    wherein the inner frame includes:
        a panel having corner portions that correspond to corner portions of the case,
        a corner sidewall provided at one of the corner portions of the panel, the corner sidewall being provided at the opening of the case, and
        a corner protrusion to project away from the corner sidewall and the corner protrusion to be provided in a corner retaining groove, and
    wherein the case includes the corner retaining groove that is recessed to receive the corner protrusion.

2. The mobile terminal according to claim 1, wherein an outer surface of the corner sidewall is substantially parallel to an outer surface of the case.

3. The mobile terminal according to claim 1, wherein the panel comprises:
    a plate, and
    a coupling portion at an end of the plate, the coupling portion formed of a different material from a material of the plate, the coupling portion including a hole, and
    wherein the corner sidewall is along an edge of a corner portion of the coupling portion.

4. The mobile terminal according to claim 1, wherein the case comprises:
    a front case; and
    a rear case to couple to the front case, and wherein the opening is recessed from an edge of a corner portion of the rear case.

5. The mobile terminal according to claim 1, wherein the case comprises:
    a front case,
    a side bezel to couple to the front case, and
    a rear case to couple to the side bezel, and wherein the opening is recessed from an edge of a corner portion of the side bezel.

6. The mobile terminal according to claim 1, wherein the case comprises:
    a front case,
    a side bezel to couple to the front case, and
    a rear case to couple to the side bezel, and wherein the opening is a penetrating hole at a corner portion of the side bezel.

7. The mobile terminal according to claim 1, further comprising:
    a back cover to detachably couple to the case, and
    wherein a gap is between the corner portion of the case and the back cover.

8. A mobile terminal to provide wireless communication comprising:
    a display device;
    a device to provide wireless communication;
    a first case;
    a second case that includes an opening at one corner portion of the second case; and
    a frame provided between the first case and the second case such that the frame contacts a rear surface of the display device, the frame including a sidewall that is exposed via the opening of the second case,
    wherein the frame has a larger rigidity than the second case, wherein the frame includes:
        a panel having corner portions that correspond to corner portions of the second case, and the sidewall provided at one corner portion of the panel, and
        a corner protrusion to project from the sidewall into a corner retaining groove of the first case.

9. The mobile terminal according to claim 8, wherein a surface of the sidewall is substantially parallel to a surface of the second case.

10. The mobile terminal according to claim 8, wherein the panel comprises:
    a plate, and
    a coupling portion at an end of the plate, the coupling portion formed of a different material from a material of the plate, the coupling portion including a hole, and
    wherein the sidewall is along an edge of a corner portion of the coupling portion.

11. The mobile terminal according to claim 8, wherein the opening is recessed from an edge of a corner portion of the second case.

12. The mobile terminal according to claim 8, further comprising a side bezel between the first case and the second case, and wherein the opening is recessed from an edge of a corner portion of the side bezel.

13. The mobile terminal according to claim 8, further comprising a side bezel between the first case and the second case, and wherein the opening is a penetrating hole at a corner portion of the side bezel.

14. The mobile terminal according to claim 8, further comprising:
 a back cover to detachably couple to the second case,
 wherein a gap is between a corner portion of the first case and a surface of the back cover.

\* \* \* \* \*